(12) United States Patent
Schug

(10) Patent No.: US 9,461,028 B2
(45) Date of Patent: Oct. 4, 2016

(54) LED CIRCUIT

(71) Applicant: KONINKLIJKE PHILIPS N.V., Eindhoven (NL)

(72) Inventor: Josef Andreas Schug, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/419,583

(22) PCT Filed: Jul. 26, 2013

(86) PCT No.: PCT/IB2013/056144
§ 371 (c)(1),
(2) Date: Feb. 4, 2015

(87) PCT Pub. No.: WO2014/024082
PCT Pub. Date: Feb. 13, 2014

(65) Prior Publication Data
US 2015/0228634 A1    Aug. 13, 2015

Related U.S. Application Data

(60) Provisional application No. 61/680,337, filed on Aug. 7, 2012.

(51) Int. Cl.
*H01L 33/00* (2010.01)
*H01L 25/16* (2006.01)
*H05B 33/08* (2006.01)
*H01L 23/538* (2006.01)

(52) U.S. Cl.
CPC ......... *H01L 25/167* (2013.01); *H01L 23/5386* (2013.01); *H05B 33/083* (2013.01); *H01L 2224/16145* (2013.01); *H01L 2224/48463* (2013.01); *H01L 2224/73253* (2013.01)

(58) Field of Classification Search
CPC . H01L 27/153; H01L 25/167; H01L 27/135; H01L 33/62
See application file for complete search history.

(56) References Cited

U.S. PATENT DOCUMENTS

| | | |
|---|---|---|
| 2002/0064032 A1 | 5/2002 | Oohata |
| 2006/0060878 A1* | 3/2006 | Kim ............... H01L 25/167 257/99 |
| 2010/0181924 A1* | 7/2010 | Van Woudenberg et al. ............ 315/186 |
| 2012/0018745 A1 | 1/2012 | Liu et al. |

* cited by examiner

*Primary Examiner* — William Harriston

(57) ABSTRACT

An LED circuit (40) comprises integrated circuit LEDs (50) each mounted over a respective LED control circuit (42). The LED control circuits (42) are electrically connected together to by the integrated circuit to define a string of LED control circuits, each having at least one control line (44) leading to the circuit. This provides a compact circuit of multiple LEDs with individual control of the LEDs.

5 Claims, 6 Drawing Sheets

LED CIRCUIT

CROSS-REFERENCE TO PRIOR APPLICATIONS

This application is the U.S. National Phase application under 35 U.S.C. §371 of International Application No. PCT/IB2013/056144, filed on Jul. 26, 2013, which claims the benefit of U.S. Patent Application No. 61/680,337, filed on Aug. 7, 2012. These applications are hereby incorporated by reference herein.

FIELD OF THE INVENTION

This invention relates to LED circuits, for example formed as discrete LED packages connected to associated circuitry.

BACKGROUND OF THE INVENTION

Various LED packages are known. For example, wafer level chip scale LED packages are known which are directly solderable on a suitable substrate. Such a package typically has two contacts to the p-n junctions of the diode. The LED package can for example be mounted to a substrate carrying control circuitry for the LED, for example ESD diodes or control transistors.

By way of example, an LED die can be mounted on a silicon substrate, in which the substrate contains an embedded ESD protection diode. Contacts on the top of the substrate make electrical connection with the LED die terminals, and the substrate has further external contacts on the same top face, outside the area where the LED die is mounted.

It is also known that in addition to ESD protection, by associating LEDs with control transistors, it becomes possible to drive and control strings of LEDs. For example, multiple LEDs in series can be controlled individually by connecting individual FET transistors parallel to each LED. By closing a transistor switch, a corresponding LED is shorted and will be switched off.

There remains a need for a cost effective and compact packaging solution for LEDs and associated control devices.

SUMMARY OF THE INVENTION

According to the invention, there is provided an apparatus as defined in the independent claim.

According to one aspect, there is provided an LED circuit, comprising a plurality of integrated circuit LED packages, and an integrated circuit comprising a set of LED control circuits, each formed in a respective areas of the circuit, and having at least one control line leading to each individual LED control circuit, wherein each LED package is bonded over a respective LED control circuit such that the LED makes electrical connection with the LED control circuit, and the LED control circuits are electrically connected together by the integrated circuit to define a string of LED control circuits.

This arrangement provides LED packages over the top of associated control circuits, so that a more compact design is possible and the LEDs can be spaced more closely if desired.

Each LED control circuit can comprise a transistor, and the at least one control line comprises a transistor gate line. This control line can thus be a thin line since it only needs to carry a gate current, and the control lines can also be arranged in a compact way.

The transistor can be in parallel with the LED, to provide a bypass path for the LED. This is of interest for a string of series LEDs, to allow individual LEDs to be turned off. Of course, a series transistor can also be used for each LED in the case of a set of parallel LEDs.

Each LED package can comprise two terminals, which are connected to the transistor source and drain (for the example of a parallel switch).

The ends of the string of LED control circuits can comprise power line connection pads. The string can thus comprise a series arrangement of LEDs. The string is preferably arranged along a straight line, and the control lines extend to one side from each LED control circuit and then extend along the direction of the string line to one or other end of the string of control circuits. This enables the control circuits to be tiled together easily if they are formed as separate devices.

Half of the control lines can extend to one end of the string of control circuits and the other half of the control lines can extend to the other end of the string of control circuits. This means the overall width can be kept to a minimum.

The invention also provides an LED circuit arrangement, comprising a plurality of LED circuits of the invention, wherein the power line connection pads of the different circuits are connected together to form a series connection of the strings of LED control circuits with a power line connection pad at each end.

This provides a tiling approach for multiple LED circuits, with the circuits daisy chained together, and able to be supplied by a single current source, for example. The LED circuits can be arranged side by side.

BRIEF DESCRIPTION OF THE DRAWINGS

An example of the invention will now be described in detail with reference to the accompanying drawings, in which.

All the Figures are schematic, not necessarily to scale, and generally only show parts which are necessary in order to elucidate the invention, wherein other parts may be omitted or merely suggested.

DETAILED DESCRIPTION

The invention provides an LED circuit comprising integrated circuit LEDs each mounted over a respective LED control circuit. The LED control circuits are electrically connected together to define a string of LED control circuits, each having at least one control line leading to the circuit. This provides a compact circuit of multiple LEDs with individual control of the LEDs.

Figure 1:
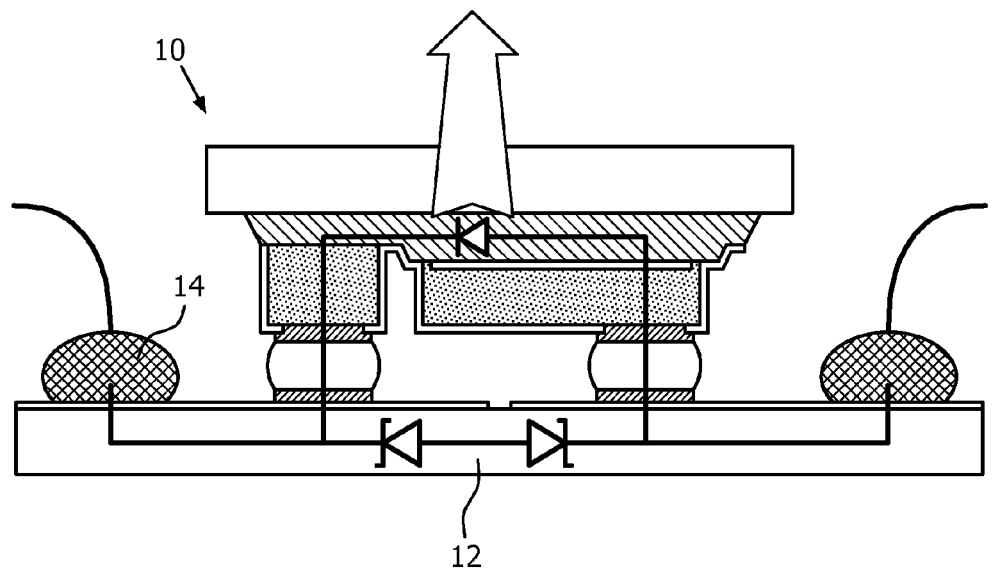
FIG. 1 shows a known LED package mounted on a submount.

FIG. 1 shows a known LED package. The LED 10 is formed as a discrete package which is mounted on a silicon submount 12 for example by solder balls. Connections to the LED package are made through the solder balls, and external connections from the submount are made by wirebonds 14. As shown schematically in FIG. 1, the submount 12 can implement a pair of ESD protection diodes. Thus, ESD protection is one reason for associating additional components with each LED.

Figure 2:
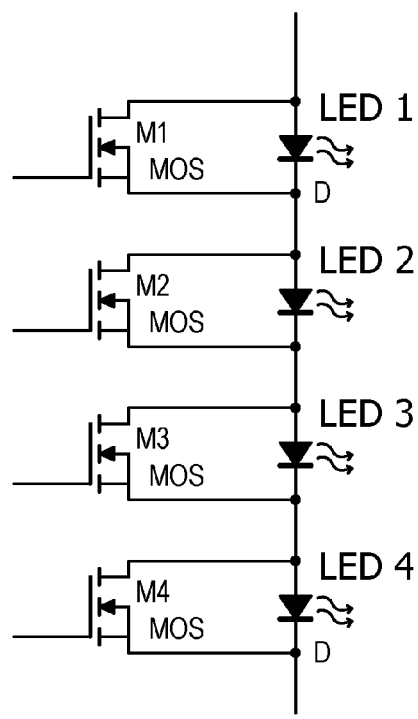
FIG. 2 shows a known circuit which provides a switch for each LED of a string.

Another reason for associating additional components with each LED is to provide switching functionality. FIG. 2 shows a known circuit which provides a parallel switch M1 to M4 for each LED of a string of LEDs, LED1 to LED4. By turning on a switch, a bypass path is provided so that the individual LED is turned off.

Figure 3:
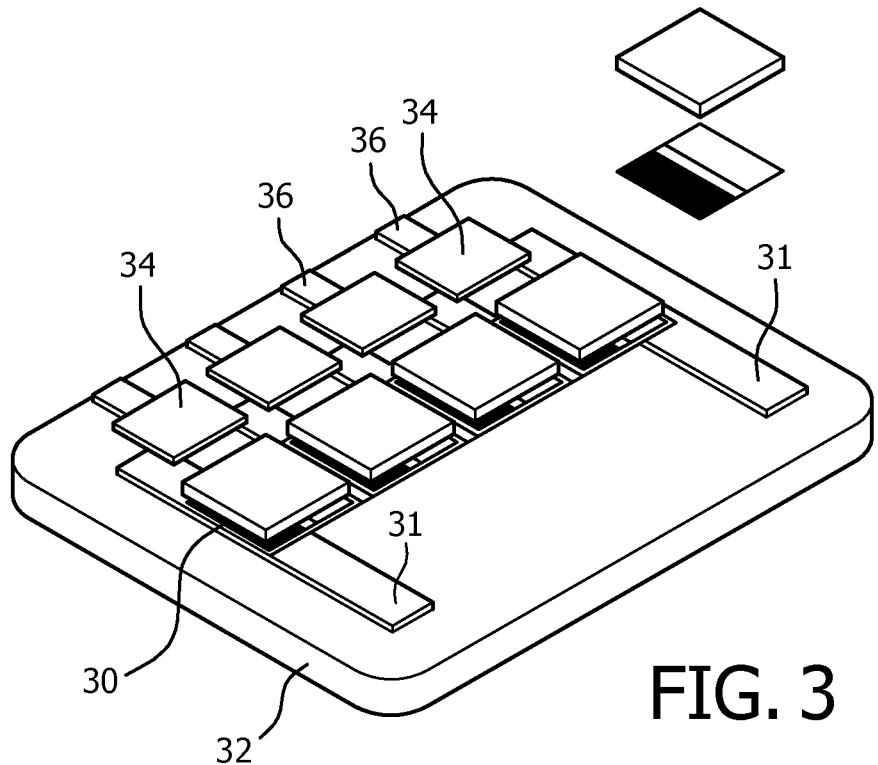
FIG. 3 shows a known way to implement the circuit of FIG. 2.

FIG. 3 shows a known way to implement the circuit of FIG. 2. A number of discrete LED packages 30 is mounted over tracks on a PCB 32. Two tracks 31 connect to two power lines. Additional tracks between the individual LED packages 30 provide the series connections between the LED packages. Further tracks connect to the transistors 34, also mounted on the PCB, and the transistors have PCB tracks which form control lines 36 connecting to their gates. FIG. 3 also shows, in exploded form, one of the LED packages. This arrangement takes up a significant amount of space.

The invention also provides discrete LED packages mounted on a substrate which carries control circuits such as a transistor for each LED, but with the LED packages mounted over their respective control circuit.

Figure 4:
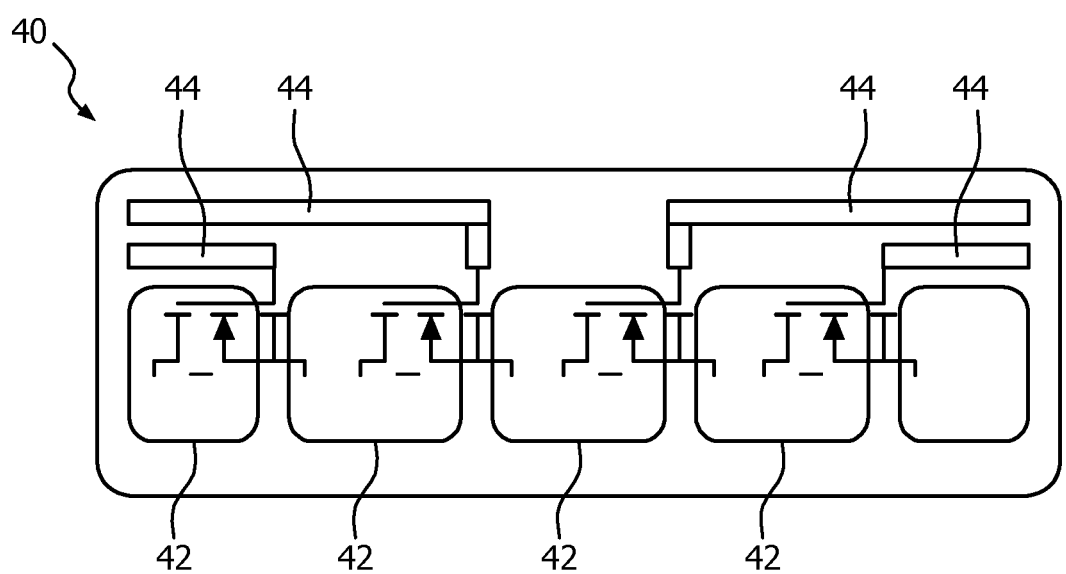
FIG. 4 shows a control circuit used in the LED circuit of the invention.

FIG. 4 shows a control circuit used in the LED circuit of the invention. The circuit 40 is formed as an integrated circuit comprising a set of LED control circuits 42, each formed in a respective area of the circuit. Each integrated circuit in this example can comprise a single transistor. A control line 44 leads to each LED control circuit, and connects to the gate of the transistor.

Figure 5:
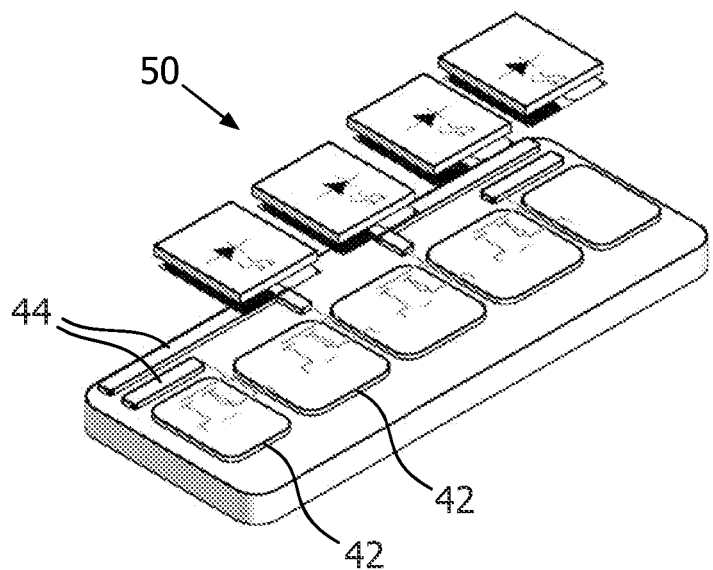
FIG. 5 shows an example of the LED circuit of the invention.

As shown in exploded view in FIG. 5, an LED package 50 is bonded over each respective LED control circuit 42 such the LED makes electrical connection with the control circuit. Conventional wafer bonding can be used, such as ultrasonic bonding typically used for single die attach methods. Other wafer bonding approaches can be used including cold interconnect methods, such as electrically conductive gluing.

For this purpose, the top of the transistor circuit 42 has two contact pads which connect to the source and drain, and the bottom of the LED packages has two contact pads which connect to the anode and cathode of the LED (i.e. the p- and n-junctions). The control circuits 42 are electrically connected together by the integrated circuit to define a string of LED control circuits.

In one example, the transistor is in parallel with the LED, and the string is a series connection, to define the circuit shown in FIG. 2. However, the transistor can instead be in series with the LED and the string can define a parallel bank of control circuits.

The ends of the string of LED control circuits comprise power line connection pads.

As shown in FIGS. 4 and 5, the string of control circuits is arranged along a straight line. The control lines 44 extend to one side from each LED control circuit (i.e. perpendicular to the string line direction) and then extend along the direction of the string line to one or other end of the string of control circuits. The control lines can be thin since they carry only a gate current, and this means they do not need to increase significantly the width of the circuit. In the example shown, half of the control lines 44 extend to one end of the string of control circuits and the other half of the control lines extend to the other end of the string of control circuits. This means that the number of side by side control lines is kept to a minimum to limit the lateral space required. The control lines could of course extend all to one end.

The ends of the string of control circuits are where external connections are made, to the power lines and to the controller, which provides the control signals to the control lines 44.

Figure 6:
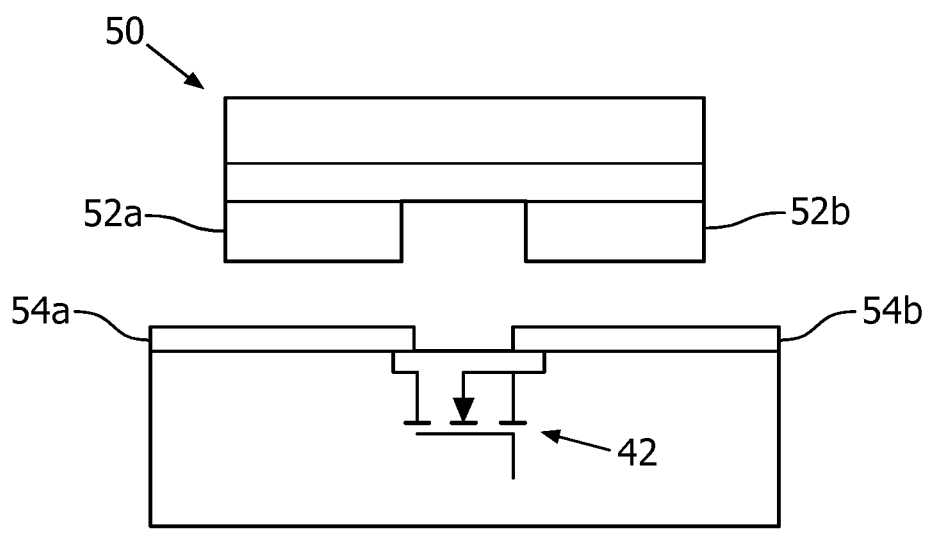
FIG. 6 how the connections are made between the LED package and the circuit.
Figure 6:
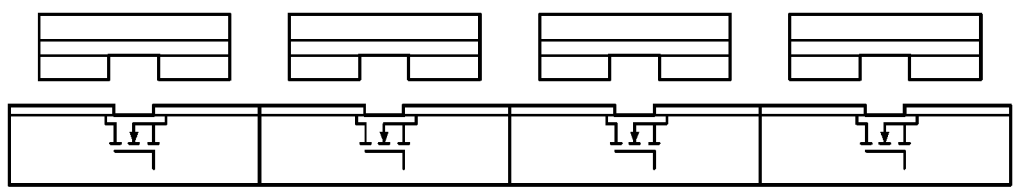

FIG. 6 shows how the connections are made between the LED package 50 and the circuit 42, and shows the anode and cathode terminals 52a, 52b at the base of the LED packages, which connect with the source and drain terminals by top contacts 54a, 54b over the integrated circuits. The top part shows a single LED package and its circuit, and the bottom part shows a line of circuits each with its associated LED package. The circuits are electrically connected together to form a chain of circuits.

Figure 7:
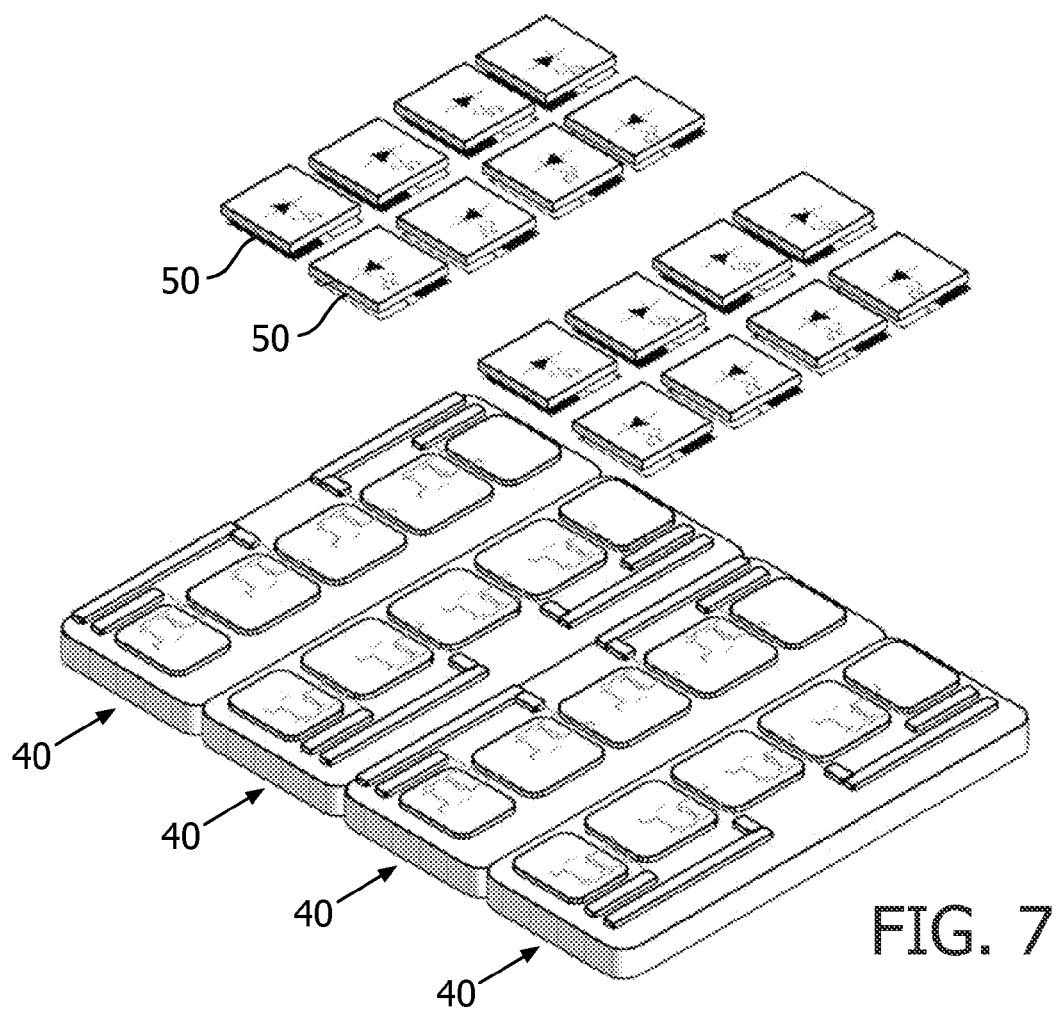
FIG. 7 shows an exploded view of an example of circuit arrangement of the invention.

FIG. 7 shows an exploded view of an example of a circuit arrangement of the invention. A plurality of the LED circuits 40 is provided side-by-side to define an array of control circuits and LED packages. The array can be formed from multiple circuits or else all the control circuits can be formed as one circuit. Two opposite edges of the array are used for providing power connections and control connections, and if separate circuits are used, interconnections between the circuits (as explained below).

The invention can thus be applied to a circuit arrangement in the form of a matrix array, for example generally an n×m array where n and m are greater than or equal to 2.

Figure 8:
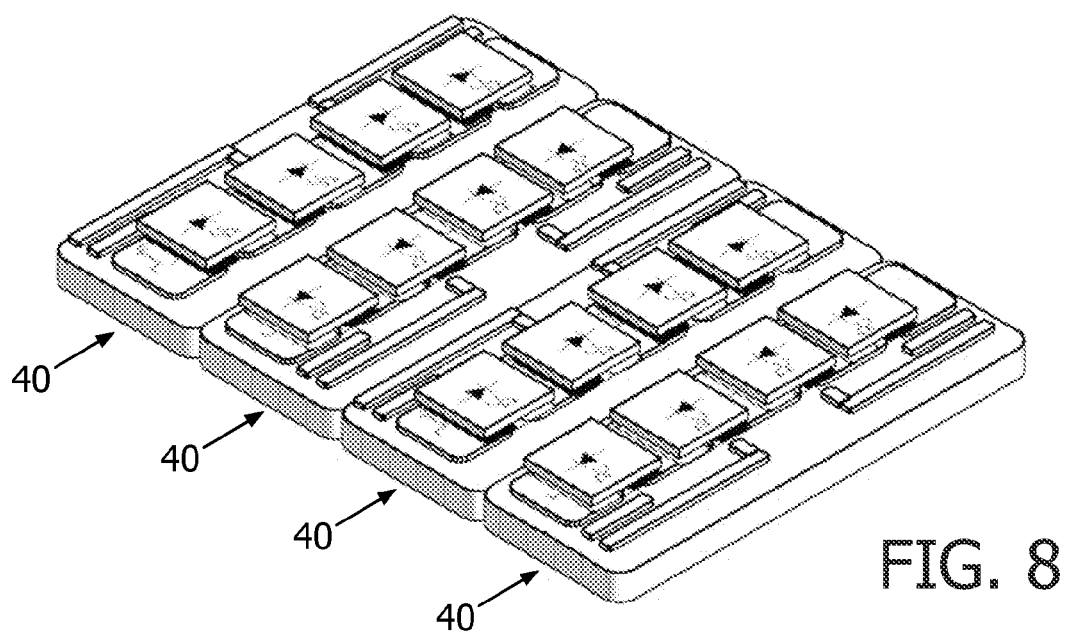
FIG. 8 shows the arrangement of FIG. 7 with the LED packages connected to the circuits.

FIG. 7 shows an exploded view, and FIG. 8 shows the arrangement of FIG. 7 with the LED packages connected to the circuits.

Figure 9:
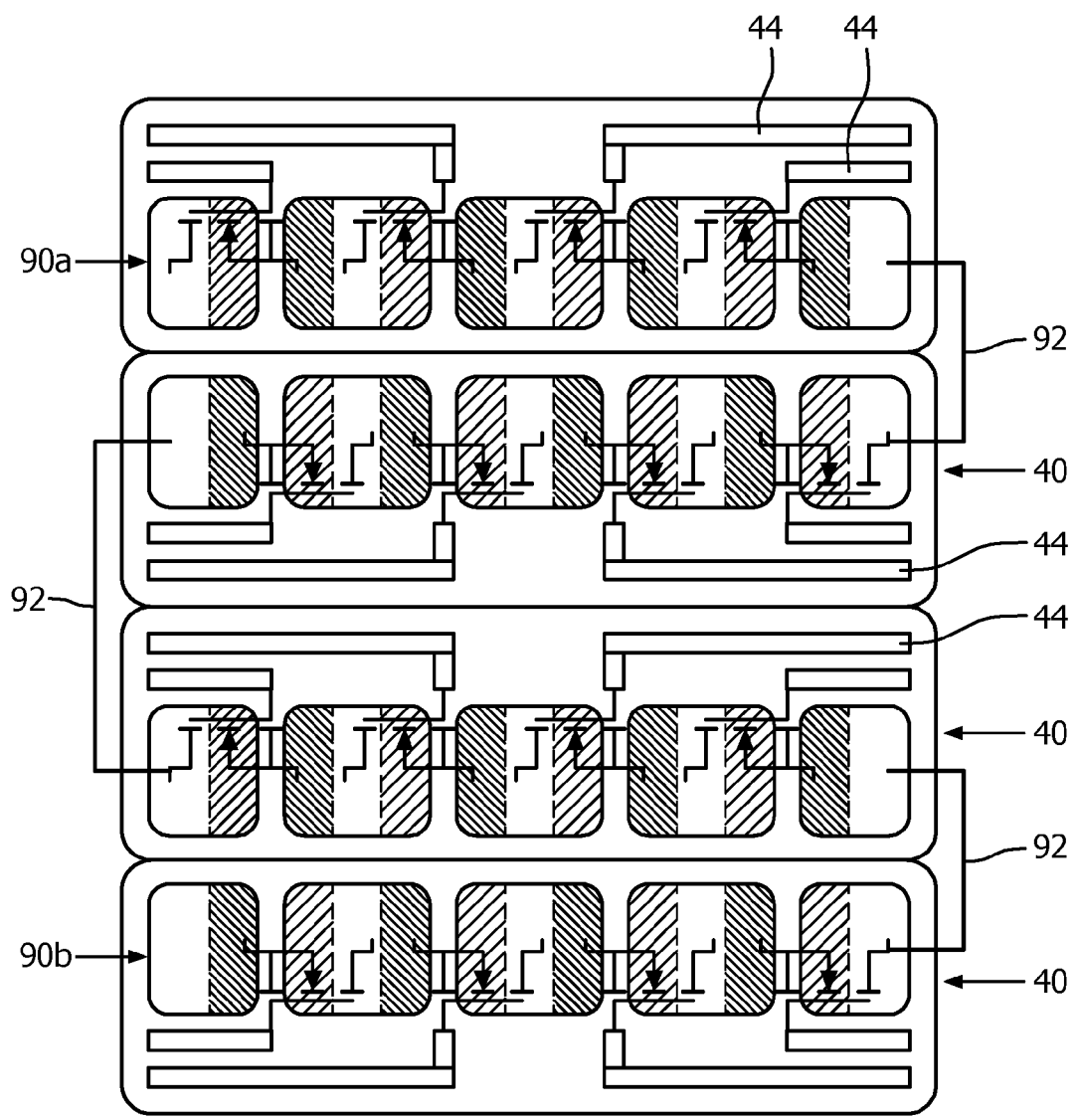
FIG. 9 shows more clearly the electrical connections between the circuits to form the circuit arrangement.

If separate circuits are used, they are connected together to form a series connection of the strings of LED control circuits with a power line connection pad at each end. FIG. 9 shows this arrangement, with power line contact pads 90a, 90b at each end of the series connection of the circuit strings, and shows the connecting bridges 92 provided between the circuits to form the circuit arrangement.

Figure 10:
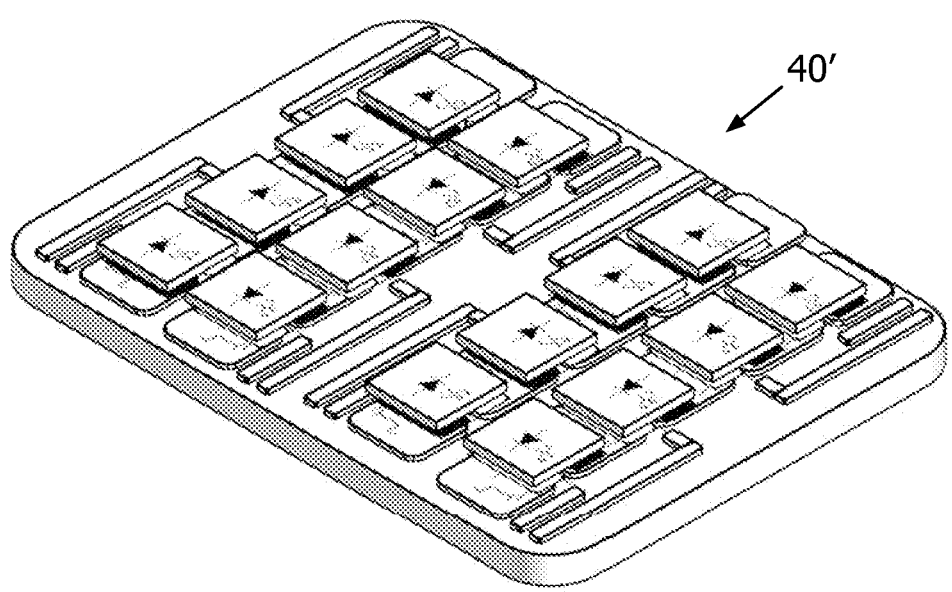
FIG. 10 shows that an array can be formed as a single circuit.

As mentioned above, an array can be formed with all the control circuits formed as one circuit. An example is shown in FIG. 10, for completeness. This corresponds to FIG. 8, but the plurality of circuits 40 is replaced by a single circuit 40'.

In the example above, a parallel switch is added to each LED. Of course, serial switches can also be added in the same way for parallel sets of LEDs, to isolate selected LEDs.

The circuit is shown as a single transistor. Of course more complex circuits could be provided in the second substrate. For example, an ESD diode can be integrated into the package as well as the transistor. Furthermore, a more complex transistor control circuit can be implemented in each package, for example for local dimming control.

The invention can be used to form LED circuits generally. Of particular interest are packages for LED arrays that require control of individual LEDs. In particular, in automotive applications a dynamic LED matrix array is known for providing dynamic control of the light direction.

The invention provides a switch for each LED package directly under the LED. This allows a compact driver design and simplifies the control of LED strings. The processes used to form the LED package and the integrated circuits have not been described in detail, as they are routine. Indeed any diode technology and any transistor technology can be used. Furthermore, the different substrates can use different materials and manufacturing processes as they are formed independently.

In the examples above, the power line connections and control line connections are at two opposite edges of the line of array of control circuits. All connections can instead be routed to one edge only if desired.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An LED circuit, comprising:
   a plurality of integrated circuit LED packages; and
   an integrated circuit comprising a plurality of LED control circuits, each of the plurality of LED control circuits being formed in a respective area of the integrated circuit, and having at least one control line leading to each individual LED control circuit,
   wherein each LED package is bonded over a respective LED control circuit such that the LED makes electrical connection with the LED control circuit, and the LED control circuits are electrically connected together in series by the integrated circuit to define a string of LED control circuits,
   wherein each LED control circuit comprises a transistor in parallel with the LED package, and the at least one control line comprises a transistor gate line and wherein the ends of the string of LED control circuits comprise power line connection pads,
   wherein the string is arranged along a straight line, and wherein the control lines extend to one side from each LED control circuit and then extend along the direction of the string to one or other end of the string of control circuits.

2. A circuit as claimed in claim 1, wherein each LED package comprises two terminals, which are connected to the transistor source and drain.

3. An LED circuit, comprising:
   a plurality of integrated circuit LED packages; and
   an integrated circuit comprising a plurality of LED control circuits, each of the plurality of LED control circuits being formed in a respective area of the integrated circuit, and having at least one control line leading to each individual LED control circuit,
   wherein each LED package is bonded over a respective LED control circuit such that the LED makes electrical connection with the LED control circuit, and the LED control circuits are electrically connected together in series by the integrated circuit to define a string of LED control circuits,
   wherein each LED control circuit comprises a transistor in parallel with the LED package, and the at least one control line comprises a transistor gate line and wherein the ends of the string of LED control circuits comprise power line connection pads,
   wherein the string is arranged along a straight line,
   wherein the control lines extend to one side from each LED control circuit and then extend along the direction of the string to one or other end of the string of control circuits, and
   wherein half of the control lines extends to one end of the string of control circuits and the other half of the control lines extends to the other end of the string of control circuits.

4. An LED circuit arrangement, comprising a plurality of LED circuits, each LED circuit comprising:
   a plurality of integrated circuit LED packages; and
   an integrated circuit, the integrated circuit comprising a set of LED control circuits, each LED control circuit being formed in a respective area of the integrated circuit, and having at least one control line leading to each individual LED control circuit,
   wherein each LED package is bonded over a respective LED control circuit such that the LED makes electrical connection with the LED control circuit, and the LED control circuits are electrically connected together in series by the integrated circuit to define a string of LED control circuits,
   wherein each LED control circuit comprises a transistor in parallel with the LED package, and the at least one control line comprises a transistor gate line and wherein the ends of the string of LED control circuits comprise power line connection pads,
   wherein the string is arranged along a straight line, and wherein the control lines extend to one side from each LED control circuit and then extend along the direction of the string to one or other end of the string of control circuits,
   wherein the power line connection pads of the different LED circuits are connected together to form a series connection of the strings of LED control circuits with a power line connection pad at each end.

5. The LED circuit arrangement as claimed in claim 4, wherein the LED circuits are arranged side by side.

* * * * *